United States Patent
Blank et al.

(10) Patent No.: US 9,324,823 B2
(45) Date of Patent: Apr. 26, 2016

(54) SEMICONDUCTOR DEVICE HAVING A TAPERED GATE STRUCTURE AND METHOD

(71) Applicant: Infineon Technologies Austria AG, Villach (AT)

(72) Inventors: Oliver Blank, Villach (AT); Rudolf Rothmaler, Villach (AT); Christof Altstaetter, Villach (AT); Minghao Jin, Villach (AT)

(73) Assignee: Infineon Technologies Austria AG, Villach (AT)

(*) Notice: Subject to any disclaimer, the term of this patent is extended or adjusted under 35 U.S.C. 154(b) by 0 days.

(21) Appl. No.: 14/460,716

(22) Filed: Aug. 15, 2014

(65) Prior Publication Data

US 2016/0049486 A1    Feb. 18, 2016

(51) Int. Cl.

| H01L 21/336 | (2006.01) |
|---|---|
| H01L 29/423 | (2006.01) |
| H01L 29/66 | (2006.01) |
| H01L 29/78 | (2006.01) |
| H01L 21/308 | (2006.01) |
| H01L 21/8234 | (2006.01) |
| H01L 29/40 | (2006.01) |

(52) U.S. Cl.
CPC ...... *H01L 29/42364* (2013.01); *H01L 21/3083* (2013.01); *H01L 29/4236* (2013.01); *H01L 29/6656* (2013.01); *H01L 29/66484* (2013.01); *H01L 29/66666* (2013.01); *H01L 29/7827* (2013.01); *H01L 29/7831* (2013.01); *H01L 21/823487* (2013.01); *H01L 29/407* (2013.01)

(58) Field of Classification Search
None
See application file for complete search history.

(56) References Cited

U.S. PATENT DOCUMENTS

| 5,017,504 A | 5/1991 | Nishimura et al. |
|---|---|---|
| 6,787,847 B2 | 9/2004 | Disney |
| 6,882,005 B2 | 4/2005 | Disney |
| 7,829,944 B2 | 11/2010 | Disney |
| 7,859,037 B2 | 12/2010 | Parthasarathy et al. |
| 8,022,456 B2 | 9/2011 | Parthasarathy et al. |
| 2002/0056884 A1 | 5/2002 | Baliga |
| 2005/0032291 A1 | 2/2005 | Baliga |
| 2005/0167749 A1 | 8/2005 | Disney |
| 2006/0097312 A1 | 5/2006 | Poelzl et al. |
| 2006/0209586 A1 | 9/2006 | Hirler |

(Continued)

FOREIGN PATENT DOCUMENTS

CN    101572236 A    11/2009

*Primary Examiner* — Angel Roman
(74) *Attorney, Agent, or Firm* — Murphy, Bilak & Homiller, PLLC (57) ABSTRACT

A semiconductor device includes a semiconductor body having a first surface vertically spaced apart from a second surface. A first trench vertically extends into the semiconductor body from the first surface and includes first and second sidewalls extending across the semiconductor body in a lateral direction that is parallel to the first surface. A field electrode is arranged in first trench and electrically insulated from the semiconductor body by a field dielectric. A first gate electrode is arranged in the first trench. The first gate electrode is electrically insulated from the field electrode by the field dielectric and is electrically insulated from the semiconductor body by a first gate oxide. The first gate electrode includes widened and tapered portions that are continuously connected and adjacent to one another in the lateral direction. The first gate oxide forms a non-perpendicular angle with the first sidewall in the lateral direction.

19 Claims, 8 Drawing Sheets

(56) References Cited

U.S. PATENT DOCUMENTS

| | | |
|---|---|---|
| 2008/0073707 A1 | 3/2008 | Darwish |
| 2009/0085106 A1 | 4/2009 | Matsunaga |
| 2009/0108343 A1 | 4/2009 | Nemtsev et al. |
| 2010/0155773 A1 | 6/2010 | Parthasarathy et al. |
| 2010/0308400 A1 | 12/2010 | Darwish et al. |
| 2013/0062688 A1* | 3/2013 | Kobayashi ............ H01L 29/407 257/330 |
| 2013/0137230 A1 | 5/2013 | Blank |

* cited by examiner

SEMICONDUCTOR DEVICE HAVING A TAPERED GATE STRUCTURE AND METHOD

TECHNICAL FIELD

The present invention generally relates to semiconductor devices and corresponding methods of formation, and more particularly relates to forming a gate structure of a semiconductor device that is resistant to high electric fields and mechanical stresses.

BACKGROUND

Semiconductor devices commonly include an electrically conductive gate electrode that is insulated from an adjacent semiconductor body by a gate oxide. During operation of the device, an electrical potential applied to the gate electrode develops across the gate oxide and controls electrical current flowing in a channel region of the semiconductor body.

Certain applications, such as power switching applications, require substantial switching voltages, which may cause device failure if not properly accounted for. Over time, dielectric materials used to form gate oxides tend to break down when subjected to excessive electric fields. Thus, the regions of the gate oxide in which the electric fields are highest represent the regions that are most vulnerable to dielectric breakdown.

The problem of dielectric breakdown may be compounded by physical defects in the gate oxide. Some of these defects occur from mechanical stresses exerted upon the gate oxide. For example, the high temperatures associated with device fabrication and operation may result in undesirable thermal expansion of the material adjacent the gate oxide. This thermal expansion may sufficiently deform the gate oxide such that performance is reduced (e.g., by increased leakage currents) or may cause complete device failure.

One process technique that addresses the above described problems involves setting a minimum gate oxide thickness that is closely monitored during device manufacturing. Gate oxide thickness plays an important role in device performance. Thickening the gate oxide decreases the capacitance but increases the on-state resistance of a device. The threshold voltage ($V_t$) of a device is a function of gate oxide thickness and the doping level of the semiconductor material in the channel region. Thus, the only way to thicken a gate-oxide and achieve a targeted threshold voltage is to reduce the doping level in the channel region, which in turn increases the on-state resistance of the device. Thus, adjustments to gate oxide thicknesses of devices result in tradeoffs between performance and reliability.

SUMMARY

A semiconductor device is disclosed. According to an embodiment, the semiconductor device includes a semiconductor body having a first surface. A first trench is formed in the semiconductor body and includes first and second sidewalls extending from the first surface in a vertical direction and a first trench bottom extending between the first and second sidewalls in a first lateral direction. There is a field dielectric filling the first trench. A second trench is formed within the first trench in the field dielectric and includes inner and outer sidewalls. The first and second sidewalls of the first trench and the inner and outer sidewalls of the second trench extend along the semiconductor body in a second lateral direction that is perpendicular to the first lateral direction and perpendicular to the vertical direction. The second trench includes a widened portion adjacent to a narrow portion in the second lateral direction. In the widened portion, the inner and outer sidewalls extend the parallel to the first sidewall in the second lateral direction. In the narrow portion, one of the inner and outer sidewalls is non-perpendicular and non-parallel to the first sidewall in the second lateral direction.

According to another embodiment, a semiconductor device is disclosed. The semiconductor device includes a semiconductor body having a first surface vertically spaced apart from a second surface. A first trench vertically extends into the semiconductor body from the first surface and includes first and second sidewalls extending across the semiconductor body in a lateral direction that is parallel to the first surface. A field electrode is arranged in the first trench and is electrically insulated from the semiconductor body by a field dielectric. A first gate electrode is arranged in the first trench. The first gate electrode is electrically insulated from the field electrode by the field dielectric and is electrically insulated from the semiconductor body by a first gate oxide. The first gate electrode includes widened and tapered portions that are continuously connected and adjacent to one another in the lateral direction. The first gate oxide forms a non-perpendicular angle with the first sidewall in the lateral direction.

Further, a method of forming a semiconductor device is disclosed. According to an embodiment, the method includes forming a first trench in a semiconductor body, the first trench including first and second sidewalls extending from a first surface of the semiconductor body in a vertical direction, and a first trench bottom extending between the first and second sidewalls in a first lateral direction. The first trench is filled up to the first surface with a field dielectric. A second trench is formed within the first trench in the field dielectric, the second trench including inner and outer sidewalls. The first and second sidewalls of the first trench and the inner and outer sidewalls of the second trench are formed so as to extend along the semiconductor body in a second lateral direction that is perpendicular to the first lateral direction and perpendicular to the vertical direction. Forming the second trench includes forming a widened portion adjacent to a narrow portion in the second lateral direction. The outer sidewalls in the widened portion extend parallel to the first sidewall in the second lateral direction. The outer sidewalls in the narrow portion extend away from the first sidewall in the second lateral direction.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1 including

FIG. 2 including FIGS. 2A-2C depicts a semiconductor device with a gate trench in a field dielectric having a widened and narrow portion wherein a sidewall of the gate trench forms a non-perpendicular angle with a sidewall of the semiconductor body, according to an embodiment.

FIG. 3 including

FIG. 5 including FIGS. 5A-5C depicts a masking step that may be used to form a gate trench that is non-perpendicular to a sidewall of the semiconductor body, according to an embodiment.

FIG. 6 including

DETAILED DESCRIPTION

Embodiments described herein provide a semiconductor device with a gate oxide that forms a non-perpendicular and non-parallel angle with the semiconductor body. The semiconductor device may be configured as a trench-gate device in which the gate electrode is formed within a trench, beneath a first surface of the semiconductor body. This arrangement may be provided by etching a first trench having first and second sidewalls in the first surface, filling the first trench with a field dielectric (e.g., by forming an interlayer dielectric in the trench) up to the first surface, etching a second trench in the field dielectric that exposes one of the first and second sidewalls, forming a gate oxide within the second trench along the exposed sidewall, and forming an electrically conductive gate electrode in the second trench adjacent to the gate oxide. The second trench is tapered such that it includes a widened portion and a narrow portion. From a plan-view perspective of the first surface, sidewalls of the second trench in the widened portion are spaced apart and parallel to one another. In the narrow portion, the sidewalls of the second trench extend towards one another. Thus, the gate electrode and gate dielectric, which are formed in the second trench, also have a corresponding tapered geometry.

Advantageously, the resulting configuration of the gate oxide gradually disperses the electric field in the gate oxide at the end of the gate structure. That is, the gradual tapering of the gate electrode and gate oxide at an end of the gate structure eliminates an abrupt corner of the oxide that is susceptible to dielectric breakdown during operation of the device. Furthermore, the mechanical durability of the gate oxide is improved because expansive forces of the adjacent material are distributed across a greater surface area and across more than two planes. Further, the ability to control gate oxide thickness is improved, as the non-perpendicular angle of the second trench in the field is less susceptible to gate oxide thinning during oxidation than a perpendicular angle.

Figure 1A:
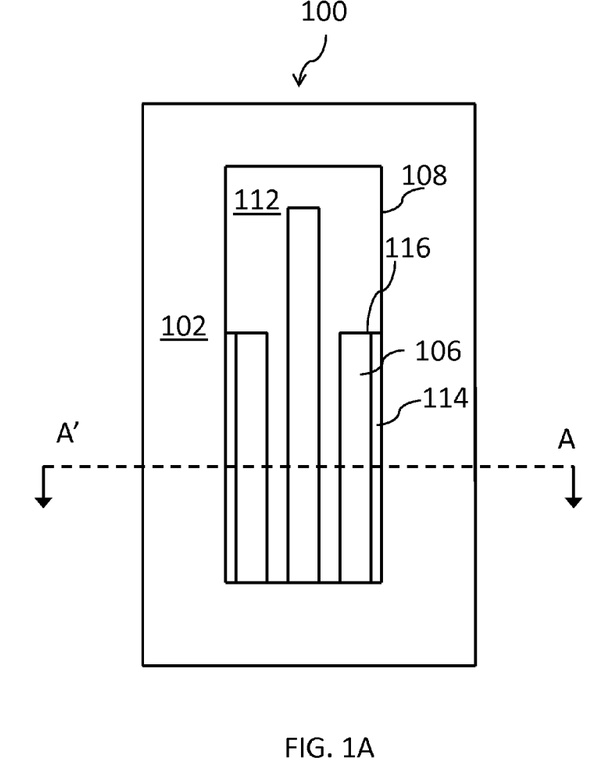
FIGS. 1A and 1B depicts a semiconductor device having a gate formed in a trench such that the gate oxide forms a perpendicular angle with the trench sidewall, according to an embodiment.
Figure 1B:
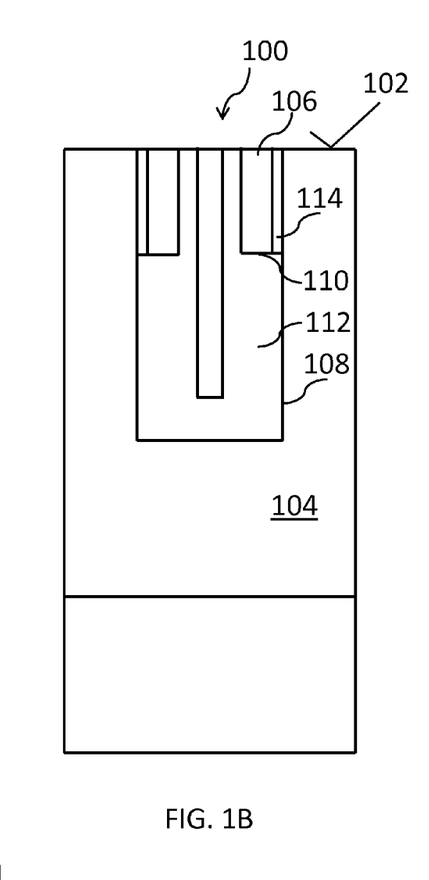

Referring to FIG. 1, a semiconductor device 100 is depicted. FIG. 1A depicts a plan-view perspective of the device 100 over a first surface 102 of the semiconductor body 104 and FIG. 1B depicts a cross-sectional perspective of the device 100 along the line A-A' indicated in FIG. 1A.

The device of FIG. 1 includes a gate electrode 106 arranged in a first trench 108 beneath the first surface 102. The gate electrode may be formed in a second trench 110 that is formed within a field dielectric 112 in the first trench 106. The gate electrode 106 is electrically insulated from the semiconductor body 104 by a gate oxide 114. The semiconductor device of FIG. 1 may formed in the manner described with reference to FIGS. 14A-14D of U.S. patent application Ser. No. 13/307,465 to Blank, the content of which is incorporated by reference in its entirety.

As shown in the top-down view of FIG. 1A, an end 116 of the gate structure including the gate electrode 106 and the gate oxide 114 forms a perpendicular angle with the sidewalls of the first trench 108. The geometry of the gate structure in FIG. 1 disadvantageously makes the device 100 more susceptible to failure arising from highly concentrated electric fields. During operation of the device 100, the highest electrical gradient arises at the corners of the gate oxide 114, including the corner at the end 116 of the gate structure. That is, the ninety degree corners of the gate oxide 114 represent a region of the device 100 that is most vulnerable to dielectric breakdown. Furthermore, the thickness of the gate oxide 114 is most difficult to control in this region. Due to phenomena such as the 2D (two-dimensional) oxidation effect and the 3D (three-dimensional) is typically thinner at corners of the first trench 106 than the adjacent regions. As a result, the gate oxide 114 is weakened and more susceptible to electrical and/or electro-thermal failure.

Figures 2, 2A:
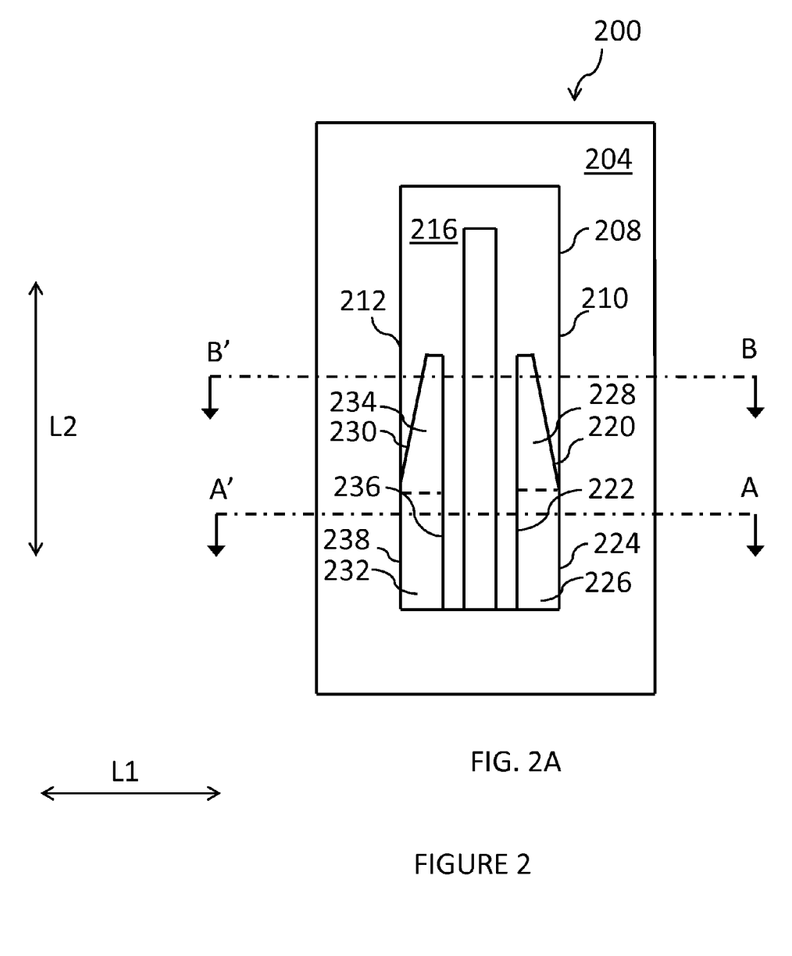
Figure 2B:
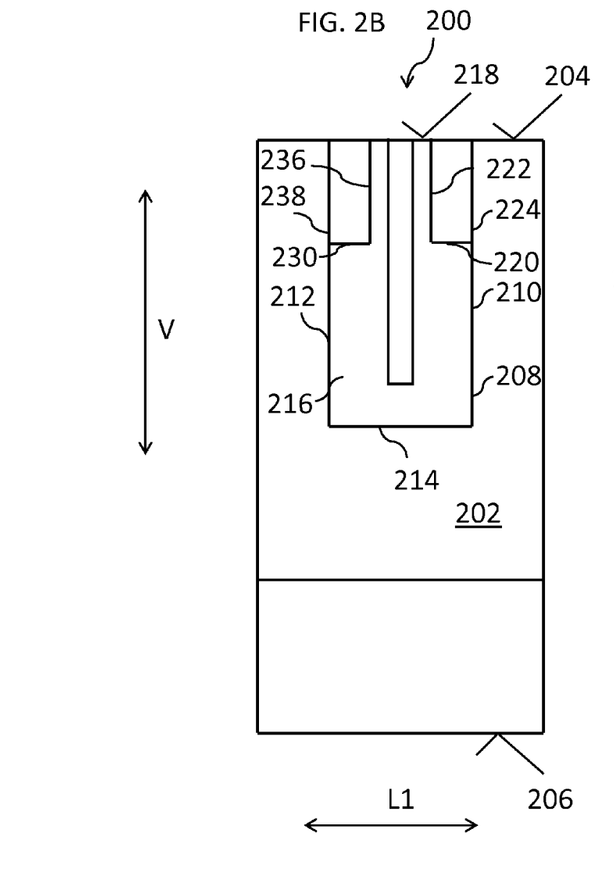
Figure 2C:
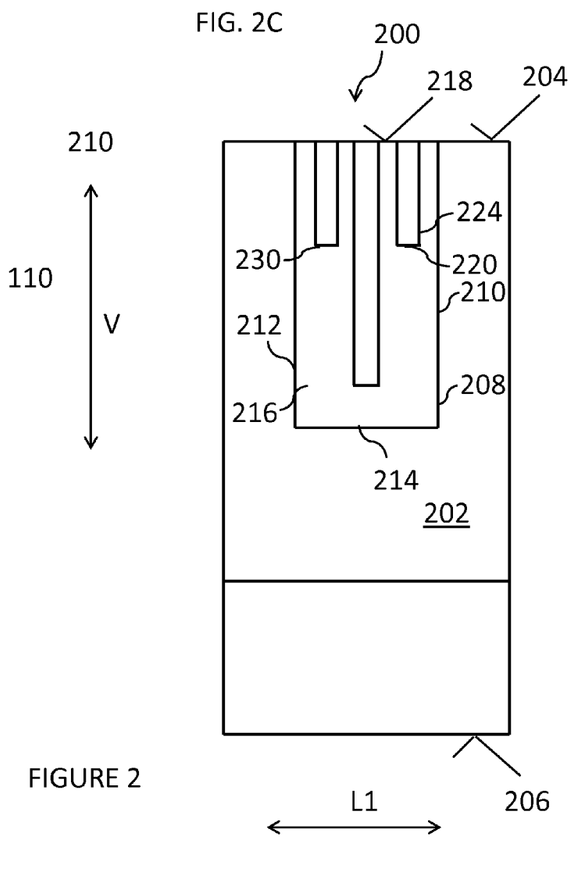

Referring to FIG. 2, a semiconductor device 200 that eliminates the ninety degree angle discussed above is depicted. FIG. 2A depicts a plan-view of the device 200. FIG. 2B depicts a cross-sectional view of the device 200 along the cross-sectional line A-A' indicated in FIG. 2A. FIG. 2C depicts a cross-sectional view of the device 200 along the cross-sectional line B-B' indicated in FIG. 2A. The planes A-A' and B-B' are parallel to one another and spaced apart from one another.

The semiconductor device 200 is formed in a semiconductor body 202 having a first surface 204 vertically spaced apart from a second surface 206. The first and second surfaces 204, 206 may be parallel to one another.

The semiconductor device 200 includes a first trench 208 having first and second sidewalls 210, 212 extending into the semiconductor body 202 from the first surface 204 and a trench bottom 214 extending between the first and second sidewalls 210, 212. The three-dimensional geometry of the first trench 208 can be described in terms of a vertical direction (V), a first lateral direction (L1), and a second lateral direction (L2). The vertical direction (V) refers to a direction perpendicular to the first surface 204. The first and second sidewalls 210, 212 extend from the first surface 204 in the vertical direction (V). The first lateral direction (L1) refers to a direction perpendicular to the vertical direction (V) and parallel to the first surface 204. The trench bottom 214 extends between the first and second sidewalls 210, 212 in the first lateral direction (L1). The second lateral direction (L2) refers to a direction perpendicular to the vertical direction (V) and perpendicular to the first lateral direction (L1). The first and second sidewalls 210, 212 extend along the semiconductor body 204 in the second lateral direction (L2). In other words, a depth of the first trench 208 is measured in the vertical direction (V), a width of the first trench 208, which refers to a distance between first and second sidewalls 210, 212, is measured in the first lateral direction (L1), and a length of the trench is measured in the second lateral direction (L2).

Within the context of the present disclosure, a surface or plane "extends in a direction" when at least a component of the surface or plane is common to the direction of extension. However, this does not require the surface or plane to be exactly parallel to the direction of extension. For example, the first and second sidewalls 210, 212 extend in the vertical direction (V). However, the first and second sidewalls 210, 212 are not necessarily perpendicular to the first surface 204. Instead, the first and second sidewalls 210, 212 may form an oblique angle (either acute or obtuse) with respect to the first surface 204. In that instance, the first and second sidewalls 210, 212 extend along a plane that includes a component of the vertical direction (V) and also includes a component of the first lateral direction (L1).

The first trench 214 is filled with a field dielectric 216. According to an embodiment, the field dielectric 216 within the first trench 214 extends to a surface 218 that is coplanar with the first surface 204 of the semiconductor body 202. In other words, the field dielectric 216 may be planarized so that the semiconductor body 202 and the field dielectric 216 form a single plane. The field dielectric 216 may be formed from an interlayer dielectric material, such as a Silicon Dioxide (SiO2) formed from, e.g., TEOS, HDP, BSG, thermal oxidation, an Oxynitride, other high-k dielectric materials, or any combination. A high-k dielectric material refers to a material having a dielectric constant greater than 3.9. By contrast, a low-k dielectric material refers to a dielectric material having a dielectric constant less than or equal to 3.9.

A second trench 220 is formed in the field dielectric 216 adjacent the first trench sidewall 210. The second trench 220 is formed within the first trench 208 such that the boundaries of the second trench 220 are coextensive with the first surface 204, the first trench sidewall 210 and the field dielectric 216. As used herein, coextensive describes a common plane that is shared between the two regions of the device 200.

The second trench 220 includes inner and outer sidewalls 222, 224 extending along the semiconductor body 202 in the second lateral direction (L2). The outer sidewall 224 is spaced closer to the first sidewall 210 of the first trench 208 whereas the inner sidewall 222 is spaced further away from the first sidewall 210 of the first trench 208.

As shown in FIG. 2A, the second trench 220 is tapered in the second lateral direction (L2) so as to include a widened portion 226 and a narrow portion 228. The widened portion 226 is adjacent to the narrow portion 228 in the second lateral direction (L2). According to an embodiment, the widened and narrow portions 226, 228 are directly adjacent to one another so as to form a continuous trench 220 extending along the second lateral direction (L2).

FIG. 2B depicts a cross-sectional view of the device 100 along the plane A-A' intersecting the widened portion 226. FIG. 2C depicts a cross-sectional view of the device along the plane B-B' intersecting the narrow portion 228.

In the widened portion 226, the inner and outer sidewalls 222, 224 extend parallel to the first sidewall 210 in the second lateral direction (L2). According to an embodiment, in the widened portion 226, the outer sidewall 224 of the second trench is coextensive with the first sidewall 210. The inner sidewall 222 may be coextensive with a planar face of the field dielectric 216.

In the narrow portion 228, one of the inner and outer sidewalls 222, 224 is non-perpendicular and non-parallel to the first sidewall 210 in the second lateral direction (L2). The non-perpendicular angle of the inner and outer sidewalls 222, 224 relative to the first sidewall 210 in the second lateral direction (L2) may be greater or less than ninety degrees (i.e., acute or obtuse). According to an embodiment, the non-perpendicular angle is between eleven and fifteen degrees.

According to the embodiment of FIG. 2, in the widened portion 226, the inner sidewall remains 222 parallel to the first sidewall 210 in the second lateral direction (L2) whereas, in the narrow portion 228, the outer sidewall 224 extends away from the first sidewall 210 and towards the inner sidewall 222 in the second lateral direction (L2). According to an embodiment, the inner sidewall 222 in both the widened and narrow portions 226, 228 forms a single plane in the field dielectric 216 extending parallel to the first sidewall 210 in the second lateral direction (L2), the outer sidewall 224 in the widened portion 226 extends parallel to the first sidewall 210 in the second lateral direction (L2), and the outer sidewall 224 in the narrow portion 228 extends along a plane that intersects with the plane of the inner sidewall 222.

According to an embodiment, the semiconductor device 200 includes a third trench 230 formed within the first trench 208 opposite from the second trench 220. The third trench 230 is formed in the field dielectric 216 and is spaced apart from the second trench 220 in the first lateral direction (L1). The third trench 230 includes a widened portion 232 adjacent to a narrow portion 234 in the second lateral direction (L2). In the widened portion 232, inner and outer sidewalls 236, 238 of the third trench 230 extend the parallel to the second sidewall 212 in the second lateral direction (L2). In the narrow portion 234, one of the inner and outer sidewalls 236, 238 is non-perpendicular and non-parallel to the second sidewall 212. The arrangement of the inner and outer sidewalls 236, 238 of the third trench 230 relative to the second sidewall 212 may be similar or identical to the arrangement of the inner and outer sidewalls 222, 224 of the second trench relative to the first sidewall 210. According to an embodiment, the outer sidewall 238 of the third trench 230 in the widened portion 232 is coextensive with the second sidewall 212 and the outer sidewall 238 of the second trench in the narrow portion 234 forms a non-perpendicular angle with the second sidewall 212.

Figure 3A:
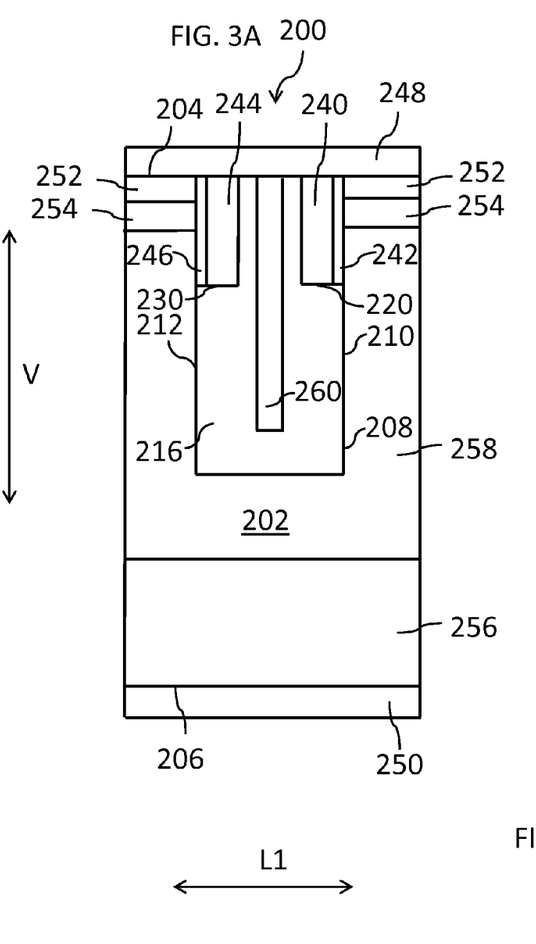
FIGS. 3A-3B depicts a semiconductor device having a gate electrode and gate oxide formed in the gate trench, according to an embodiment.
Figure 3B:
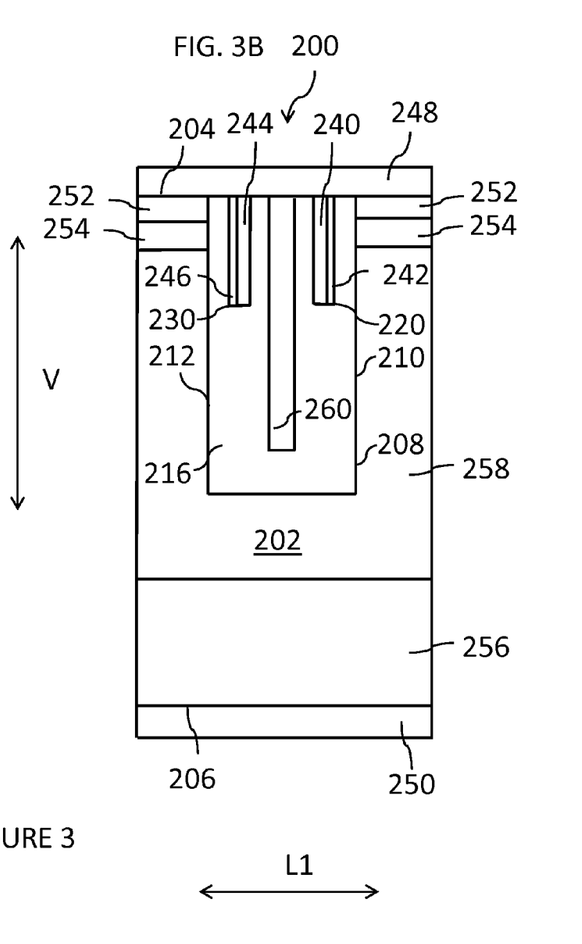

Referring to FIG. 3, a semiconductor device 200 that is configured as a transistor, such as a MOSFET or an IGBT is depicted. The semiconductor device 200 utilizes the second and third trenches 220, 230 as described with reference to FIG. 2 as gate trenches of the transistor. FIG. 3A depicts a cross-sectional view of the device 200 along the plane A-A' intersecting the widened portion 226 of the second trench 220. FIG. 3B depicts a cross-sectional view of the device along the plane B-B' intersecting the narrow portion 228 the second trench 220.

According to an embodiment, a first electrically conductive gate electrode 240 is arranged in the second trench 220. The first gate electrode 240 is electrically insulated from the semiconductor body 202 by a first gate oxide 242 interposed between the between the first gate electrode 240 and the semiconductor body 202. The first gate oxide 242 may be interposed between the first gate electrode 240 and the first sidewall 210 (e.g., in the case of a deposited gate oxide 242). Alternatively, the first gate oxide 242 may extends from the first sidewall 210 into the semiconductor body 202 (e.g., in the case of a thermally grown gate oxide 242). Optionally, a second electrically conductive gate electrode 244 may be arranged in the second trench 230. The second gate electrode 244 is electrically insulated from the semiconductor body 202 by a second gate oxide 246 interposed between the second gate electrode 244 and the semiconductor body 202 in a similar manner as described above with reference to the first gate electrode 240 and the first gate oxide 242.

The geometry of the second and third trenches 220, 230 defines the geometry of the first and second gate electrodes 240, 244 and the geometry of the corresponding first and second gate oxides 242, 246. Thus, the first gate electrode 240 includes a widened portion corresponding to the widened portion 226 of the second trench 230 and a tapered portion corresponding to the narrow portion 228 of the second trench 230. Likewise, the second gate electrode 244 includes a widened portion corresponding to the widened portion 232 of the third trench 230 and a tapered portion corresponding to the narrow portion 234 of the third trench 230. The first and second gate electrodes 220, 230 may be continuous structures with the widened and tapered portions directly adjacent one another in the second lateral direction (L2)

The first and second gate electrodes 220, 230 may be formed from a conductive material, such as a metal conductor (e.g., Aluminum or Copper) or a semiconducting material, such as a highly doped polysilicon or a lightly doped silicon or any combination. The first and second gate oxide 242, 246 may be formed from any of a variety of gate insulator materials, such as $SiO_2$, Oxynitride, Alumina, or a high-k dielectric material.

In the embodiment of FIG. 3, the semiconductor device 200 is a vertical transistor configured to control a load current flowing in the vertical direction (V). The device 200 includes an electrically conductive source electrode 248 arranged at the first surface 204 and an electrically conductive drain electrode 250 arranged at the second surface 206.

The vertical transistor device 200 of FIG. 3 includes a source region 252 adjoining the first surface 204 and electrically connected to the source electrode 248. The device 200 further includes a drain region 256 adjoining the second surface 206 and electrically connected to the drain electrode 250. A channel region 254 is arranged between the source and drain regions 252, 256 in the vertical direction (V). The source and drain regions 252, 256 may have the first doping type (e.g., n-type) whereas the channel region 254 may have the second doping type (e.g., p-type). Optionally, the device 200 includes a drift region 258 between the channel region 254 and the drain region 256 having either the first or second doping type. The gate electrodes 240, 244 are electrically connected to a control terminal of the device 200 in another lateral region of the device 200 that is not shown in the cross-sectional perspective of FIG. 3. According to an embodiment, the first and second gate electrodes 240, 244 are electrically connected to one another. This electrical connection may be effectuated by a conductive metallization and/or polysilicon regions arranged above the first surface 204. In this embodiment, the first and second gate electrodes 240, 244 are configured to provide the gate of a single vertical cell that controls current flowing through the channel region 254. Alternatively, the first and second gate electrodes 240, 244 may be disconnected from one another so as to form the gates of two separate transistors.

Alternatively, the semiconductor device 200 may be configured as a lateral transistor in which a load current flows in the second lateral direction (L2). In this embodiment, both of the source and drain regions 252, 256 extend to the first surface 204 and electrically connect to electrodes at the first surface 204

The device of FIG. 3 is configured such that the gate oxide forms a non-perpendicular angle (acute or obtuse) with the semiconductor body 202 at an end of the gate electrode. That is, the gate oxide is non-perpendicular and non-parallel to the first trench sidewalls 210, 212 with respect to the second lateral direction (L2) at an end of the gate electrode. According to an embodiment, the gate oxide directly adjacent the tapered portion of the first and second gate electrodes 240, 244 forms a non-perpendicular angle with the first second sidewalls, 210, 212, respectively, in the second lateral direction. This non-perpendicular angle is realized by forming the gate oxide and gate electrode in the second and third trenches 220, 230 configured as previously discussed.

According to an embodiment, only the first gate oxide 242 is interposed between the widened portion of the first gate electrode 240 and the semiconductor body 202. That is, in a portion of the first gate electrode 240 corresponding to the widened portion 224 of the second trench 220, the first gate oxide 242 occupies all of the space in the first lateral direction (L1) between the first gate electrode 240 and the semiconductor body 202. By contrast, the field dielectric 216 is interposed between the tapered portion of the first gate electrode 240 and the semiconductor body 202. That is, in the portions of the first gate electrode 240 corresponding to the narrow portion 228 of the second trench 220, the field dielectric 216 occupies some of the space in the first lateral direction (L1) between the first gate electrode 240 and the first sidewall 210. The second gate electrode 244 and the second gate oxide 246 may be configured similarly or identically, relative to the second sidewall 216.

The device 200 may also include a field electrode 260 arranged the in first trench 208 between the gate electrodes 240, 244. The field electrode 260 is electrically insulated from the gate electrodes 240, 244 and from the semiconductor body 202 by the field dielectric 216. The field electrode 260 may be may be formed from any conductive material, such as a metal conductor (e.g., Aluminum or Copper) or a highly doped polysilicon. In a commonly known-manner, the field electrode 260 may be biased so as to compensate for excess charges in the drift region 258 of the device 200 during operation.

Figure 4:
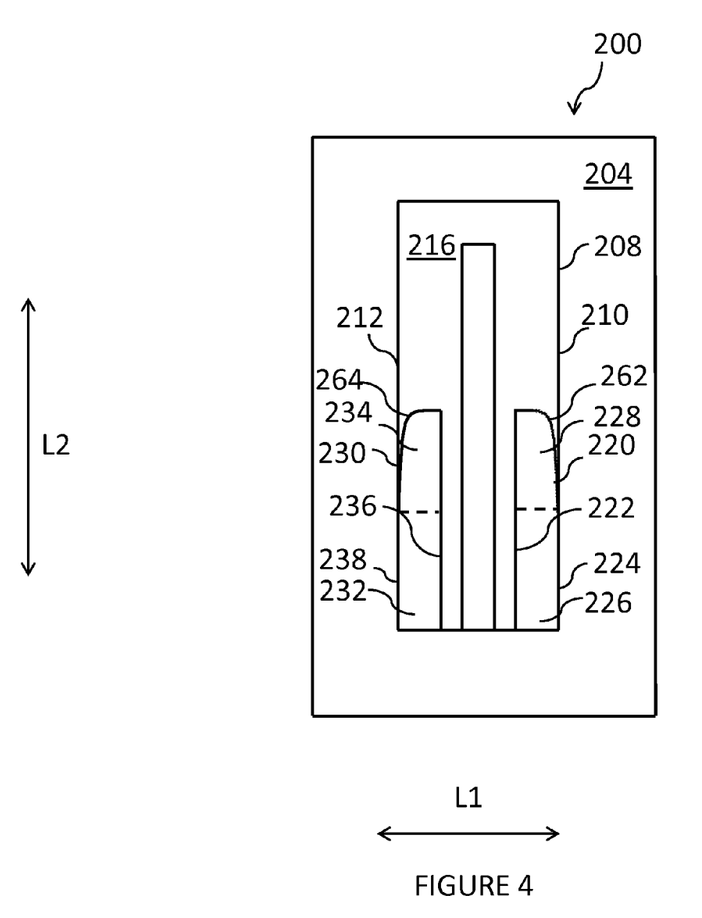
FIG. 4 depicts an alternate configuration of the widened and narrow portions of the gate trench, according to an embodiment.

Referring to FIG. 4, an alternate embodiment of the second and third trenches 220, 230 is depicted. The semiconductor device 200 is identical to the semiconductor device 200 of FIG. 2 in all respects, except the second and third trenches 220, 230 include curved surfaces 262, 264 in the narrow portions 228, 234. The second and third trenches 220, 230 may be used in a device 200 with gate electrodes 240, 244 and gate oxides 242, 246 that conform to the geometry depicted in FIG. 4. That is, in the embodiment of FIG. 3, the tapering of the first gate electrode 240 in the narrow portion 228 is achieved by arranging the inner and outer sidewalls 222, 224 in the narrow portion 228 of the second trench 220 along two intersecting planes, whereas in the embodiment of FIG. 4, the tapering of the first gate electrode 240 in the narrow portion is achieved by curving one of the inner and outer sidewalls 222, 224 towards the other. According to an embodiment, the outer sidewall 224 in the narrow portion 228 curves towards the inner sidewall 222 in the second lateral direction (L2). Thus, the non-perpendicular feature of the second trench 220 and first gate oxide 242 with respect to the first sidewall 210 is realized by the curved surface 262, which curves away from the first sidewall 210. Likewise, the non-perpendicular feature of the third trench 230 and the second gate oxide 242 with respect to the second sidewall 212 may realized by the curved surface 264, which curves away from the second sidewall 212.

Figures 5, 5A:
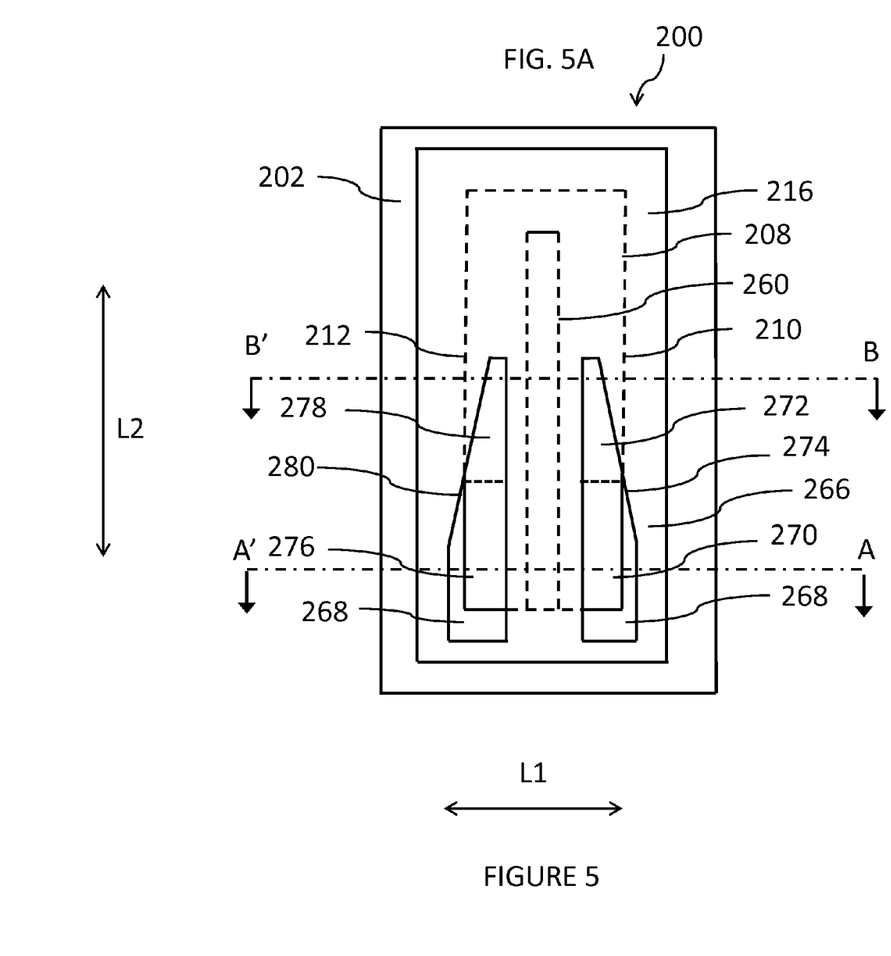
Figure 5B:
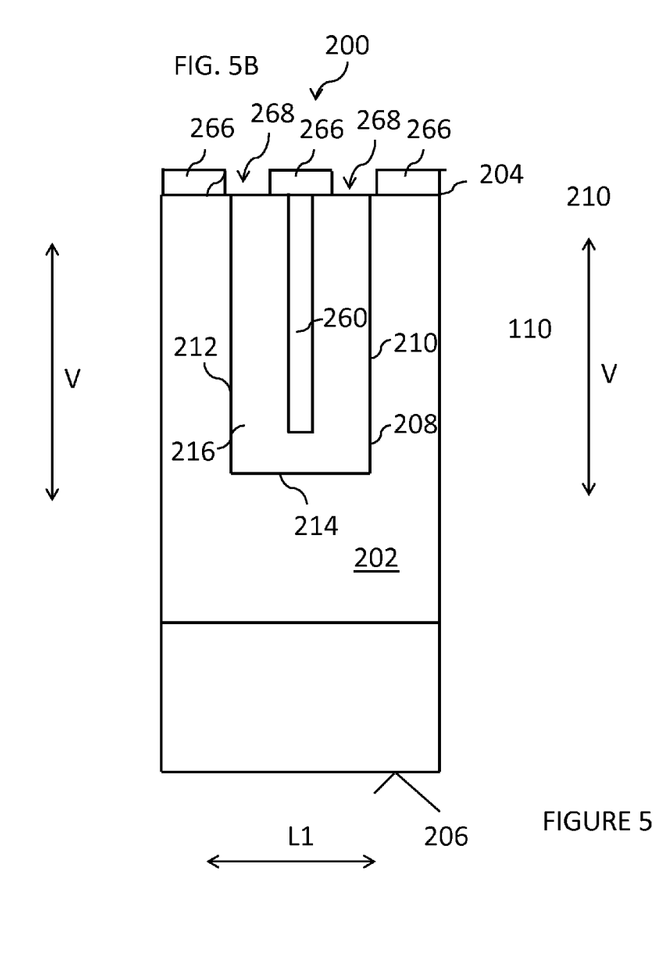
Figure 5C:
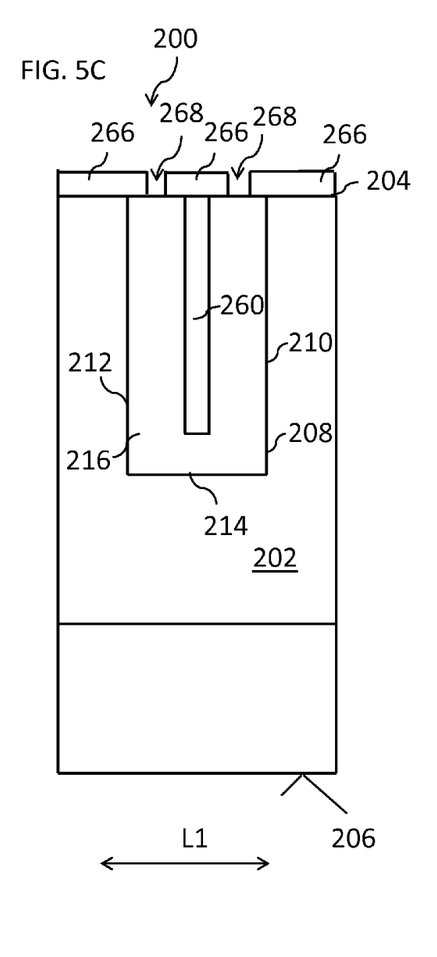
Figure 6A:
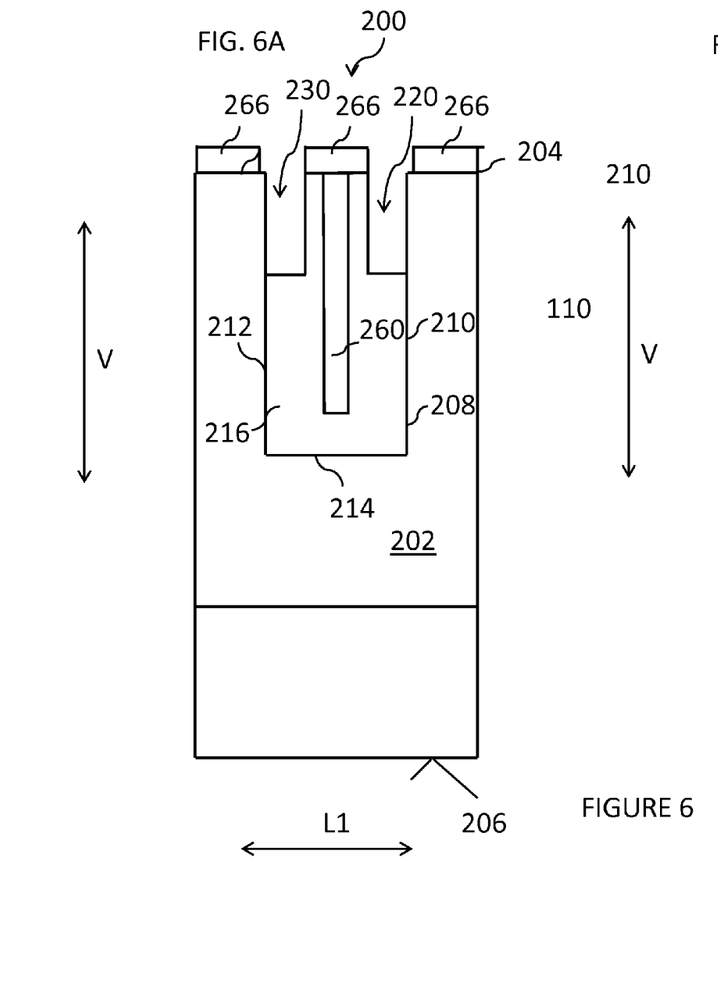
FIGS. 6A-6B depicts a semiconductor device after masked etching of the field dielectric to form the gate trench, according to an embodiment.
Figure 6B:
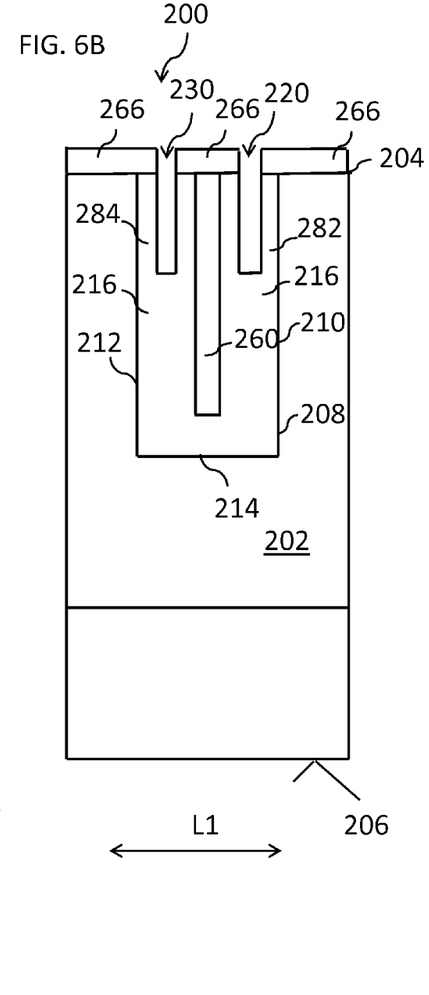

FIGS. 5-6 depict selected method steps of forming the semiconductor device 200 as previously discussed, according to an embodiment. FIG. 5A depicts a plan-view of the device 200. FIG. 5B depicts a cross-sectional view of the device 200 along the cross-sectional line A-A' indicated in FIG. 2A. FIG. 5C depicts a cross-sectional view of the device 200 along the cross-sectional line B-B' indicated in FIG. 5A. The planes A-A' and B-B' are parallel to one another and spaced apart from one another According to the method, a semiconductor body 202 is provided. The semiconductor body may formed from an commonly utilized semiconductor material, including, silicon (Si), silicon carbide (SiC), germanium (Ge), a silicon germanium crystal (SiGe), gallium nitride (GaN), gallium arsenide (GaAs), and the like. The first trench 208, field dielectric 216 and field electrode 260 as disclosed herein are formed in the semiconductor body 202. These features may be formed according to known techniques, including the methods discussed in U.S. patent application Ser. No. 13/307,465 to Blank. Subsequently, the second and third trenches 220, 230 having the geometry described herein are formed in the field dielectric 216 within the first trench 208 by providing a mask 266 over the first surface. The mask 266 may be formed from any commonly utilized photo-resist material. The mask is configured to uncover an etch area 268 of the first dielectric material 216 directly adjacent the first and second sidewalls 210, 212.

The widened portion 226 of the second trench 230 may be formed by configuring the mask 266 such that a first portion 270 of the etch area 268 uncovers both the first dielectric material 216 and the semiconductor body 202. The narrow portion 228 of the second trench 220 may be formed by configuring the mask 266 such that a boundary line 274 between the mask 266 and the etch area 268 that intersects with the first dielectric material 216 and forms a non-perpendicular angle with the first sidewall 210 with respect to the second lateral direction (L2). The widened and narrow portions 232, 234 of the third trench 230 may be formed by configuring the mask 266 with corresponding third and fourth portions 276, 278 of the etch area 268 and a corresponding boundary line 274 forming a non-perpendicular angle with the second sidewall 212 with respect to the second lateral direction (L2).

FIG. 6 depicts the device of FIG. 5 after a masked etching step in which the first dielectric material 216 is etched selective to the semiconductor body 202. In the masked etching step, the exposed portions of the first dielectric material 216 are removed and the material of the semiconductor body 202 underneath the mask 216 remains substantially intact. According to an embodiment, the etching process is an anisotropic etching process in which the dielectric material 216 is only removed in the vertical direction (V). The etching process may be a wet-chemical etch, for example.

Because the first dielectric material 216 is etched selective to the semiconductor body 202, the outer sidewalls 224, 238 of the first and second trenches 220, 230 in the widened portions 226, 232 are coextensive with the first and second sidewalls 210, 210. That is, all of the first dielectric material 216 extending to the first and second sidewalls 210, 210 in the first lateral direction (L1) is exposed by the mask 266 and is therefore removed during the etching. Further, because etching process is an anisotropic etching process, vertical regions 282, 284 of the field dielectric 216 between the outer sidewalls 224, 238 of the second and third trenches 220, 230 in the narrow portions 228, 234 remain intact.

After etching the second and third trenches 220, 230, the mask 266 may be removed. Subsequently, the exposed semiconductor body 202 in the second and third trenches 220, 230 may be oxidized to form the first and second gate oxides 242, 246 discussed with reference to FIGS. 2-4. The material used for the first and second gate oxides 242, 246 must conform to strict parameters (e.g., thickness, impurity concentration, etc.), as these parameters substantially contribute to the performance and reliability of the fully-manufactured semiconductor device 200. In the above described sequence, the field dielectric 216 is formed in a low-temperature process and may include material defects. Further, the thickness of the features that may be formed in the field dielectric 216 is limited by the capability of an etching process. By contrast, the first and second gate oxides 242, 246 may be formed in a subsequent high-temperature oxidation step. This sequence provides first and second gate oxides 242, 246 that are free of contamination and dislocation and have highly controlled thicknesses. After oxidizing the semiconductor body 202, the first and second gate electrodes 240, 244 as described with reference to FIGS. 2-4 may be formed.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

The term "substantially" encompasses relationships or physical features of the elements that are both exactly in conformity with the requirement as well as minor deviations from the requirements due to manufacturing process variations, assembly, and other factors that may cause a deviation from the ideal.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a semiconductor body having a first surface;
a first trench formed in the semiconductor body, the first trench comprising first and second sidewalls extending from the first surface in a vertical direction and a first trench bottom extending between the first and second sidewalls in a first lateral direction;
a field dielectric filling the first trench; and
a second trench formed within the first trench in the field dielectric comprising inner and outer sidewalls,
wherein first and second sidewalls of the first trench and the inner and outer sidewalls of the second trench extend along the semiconductor body in a second lateral direction that is perpendicular to the first lateral direction and perpendicular to the vertical direction, and
wherein the second trench comprises a widened portion adjacent to a narrow portion in the second lateral direction, wherein, in the widened portion, the inner and outer sidewalls extend the parallel to the first sidewall in the second lateral direction, and wherein, in the narrow portion, one of the inner and outer sidewalls is non-perpendicular and non-parallel to the first sidewall in the second lateral direction.

2. The semiconductor device of claim 1, wherein, in the narrow portion, the inner sidewall is parallel to the first sidewall in the second lateral direction and the outer sidewalls extends away from the first sidewall and towards the inner sidewall in the second lateral direction.

3. The semiconductor device of claim 2, wherein, in the widened portion, the outer sidewall of the second trench is coextensive with the first sidewall.

4. The semiconductor device of claim 2, wherein the outer sidewall of the second trench forms a non-perpendicular angle between eleven and fifteen degrees with the first sidewall in the second lateral direction.

5. The semiconductor device of claim 3, wherein the outer sidewall of the second trench in the narrow portion comprises a curved surface that curves inward towards the inner sidewall in the second lateral direction.

6. The semiconductor device of claim 2, further comprising:
a third trench formed within the first trench in the field dielectric comprising inner and outer sidewalls, the third trench spaced apart from the second trench in the first lateral direction,
wherein the third trench comprises a widened portion adjacent to a narrow portion in the second lateral direction, wherein, in the widened portion of the third trench, the inner and outer sidewalls extend the parallel to the second sidewall in the second lateral direction, and wherein, in the narrow portion of the third trench, one of the inner and outer sidewalls is non-perpendicular and non-parallel to the second sidewall, and
wherein the outer sidewall of the third trench in the widened portion is coextensive with the second sidewall, and wherein the outer sidewall of the third trench in the narrow portion forms a non-perpendicular angle with the second sidewall.

7. The semiconductor device of claim 5, further comprising:
an electrically conductive field electrode between the second and third trenches and electrically insulated by the field dielectric;
a first electrically conductive gate electrode arranged in the second trench and electrically insulated from the semiconductor body by a gate oxide interposed between the first gate electrode and the semiconductor body; and
a second electrically conductive gate electrode arranged in the third trench and electrically insulated from the semiconductor body by a gate oxide interposed between the second gate electrode and the semiconductor body.

8. The semiconductor device of claim 5, wherein the inner sidewalls of the second and third trenches in both the widened and narrow portions are each coextensive with a single plane in the field dielectric extending parallel to the first and second sidewalls, respectively.

9. A semiconductor device, comprising:
a semiconductor body having a first surface vertically spaced apart from a second surface;
a first trench vertically extending into the semiconductor body from the first surface and comprising first and second sidewalls extending across the semiconductor body in a lateral direction that is parallel to the first surface;
a field electrode arranged in the first trench and electrically insulated from the semiconductor body by a field dielectric;
a first gate electrode arranged in the first trench, the first gate electrode electrically insulated from the field electrode by the field dielectric and electrically insulated from the semiconductor body by a first gate oxide,
wherein the first gate electrode comprises widened and tapered portions that are continuously connected and adjacent to one another in the lateral direction;
wherein the first gate oxide forms a non-perpendicular angle with the first sidewall in the lateral direction.

10. The semiconductor device of claim 9, wherein only the first gate oxide is interposed between the widened portion and the semiconductor body, and wherein the field dielectric is interposed between the tapered portion and the first sidewall.

11. The semiconductor device of claim 9, further comprising:
a second gate electrode arranged in the first trench opposite from the first gate electrode, the second gate electrode electrically insulated from the field electrode by the field dielectric and electrically insulated from the semiconductor body by a second gate oxide,
wherein the second gate electrode comprises widened and tapered portions that are continuously connected and adjacent to one another in the lateral direction
wherein only the second gate oxide is interposed between the widened portion and the semiconductor body,
wherein the field dielectric is interposed between the tapered portion and the second sidewall.

12. The semiconductor device of claim 11, wherein the first and second gate electrodes are electrically connected to one another.

13. The semiconductor device of claim 11, wherein the device is configured as a vertical transistor, the vertical transistor comprising:
an electrically conductive source electrode arranged on the first surface; and
an electrically conductive drain electrode arranged the second surface.

14. A method of forming a semiconductor device, the method comprising:
forming a first trench in a semiconductor body, the first trench comprising first and second sidewalls extending from a first surface of the semiconductor body in a vertical direction, and a first trench bottom extending between the first and second sidewalls in a first lateral direction,
filling the first trench up to the first surface with a field dielectric;
forming a second trench within the first trench in the field dielectric, the second trench comprising inner and outer sidewalls;
wherein the first and second sidewalls of the first trench and the inner and outer sidewalls of the second trench are formed so as to extend along the semiconductor body in a second lateral direction that is perpendicular to the first lateral direction and perpendicular to the vertical direction,
wherein forming the second trench comprises forming a widened portion adjacent to a narrow portion in the second lateral direction, wherein the outer sidewalls of the second trench in the widened portion extend parallel to the first sidewall in the second lateral direction, and wherein the outer sidewalls of the second trench in the narrow portion extend away from the first sidewall in the second lateral direction.

15. The method of claim 14, wherein forming the second trench comprises:
providing a mask over the first surface so as to uncover an etch area of the first dielectric material directly adjacent the first sidewall, wherein a boundary line between the mask and the etch area forms a non-perpendicular angle in the second lateral direction with respect to the first sidewall; and
etching the first dielectric material.

16. The method of claim 15, wherein the forming the widened portion comprises:
configuring the mask such that a first portion of the etch area uncovers both the first dielectric material and the semiconductor body; and etching the first dielectric material selective to the semiconductor body such that the outer sidewall of the second trench is coextensive with the first sidewall in the widened portion.

17. The method of claim 15, wherein the forming the narrow portion comprises:
configuring the mask such that the boundary line intersects with the first dielectric material and the first sidewall; and
etching the first dielectric material by an anisotropic etching process such that a vertical region of the outer sidewall of the second trench between the boundary line and the first sidewall remains intact.

18. The method of claim 15, further comprising:
forming a first gate oxide in the second trench after forming the second trench in the field dielectric; and
forming a first gate electrode in the second trench such that first gate electrode in the widened portion is insulated from the semiconductor body only by the gate oxide and such that first gate electrode in the narrow portion is insulated from the first sidewall by the field dielectric.

19. The method of claim 18, further comprising:
forming a third trench within the first trench in the field dielectric spaced apart from the first trench, the third trench comprising inner and outer sidewalls, wherein forming the third trench comprises forming a widened portion adjacent to a narrow portion in the second lateral direction, wherein the outer sidewalls of the third trench in the widened portion extend parallel to the second sidewall in the second lateral direction, and wherein the outer sidewalls of the second trench in the narrow portion extend away from the second sidewall in the second lateral direction;
forming a second gate oxide in the third trench after forming the third trench in the field dielectric; and
forming a second gate electrode in the third trench such that second gate electrode in the widened portion is insulated from the semiconductor body only by the gate oxide and such that second gate electrode in the narrow portion is insulated from the first sidewall by the field dielectric.

\* \* \* \* \*